US008997027B2

(12) United States Patent
Hamouda et al.

(10) Patent No.: US 8,997,027 B2
(45) Date of Patent: Mar. 31, 2015

(54) METHODS FOR MODIFYING AN INTEGRATED CIRCUIT LAYOUT DESIGN

(71) Applicant: GLOBALFOUNDRIES, Inc., Grand Cayman (KY)

(72) Inventors: Ayman Hamouda, Fishkill, NY (US); Mohab Anis, New Cairo (EG)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/955,342

(22) Filed: Jul. 31, 2013

(65) Prior Publication Data

US 2015/0040080 A1 Feb. 5, 2015

(51) Int. Cl.
*G06F 17/50* (2006.01)

(52) U.S. Cl.
CPC .................................. *G06F 17/5081* (2013.01)
USPC .................. 716/53; 716/51; 716/52; 716/54; 716/55; 430/5; 430/30

(58) Field of Classification Search
USPC ...................................... 716/50–56; 430/5, 30
See application file for complete search history.

(56) References Cited

U.S. PATENT DOCUMENTS

| | | | | |
|---|---|---|---|---|
| 7,237,221 B2 * | 6/2007 | Granik et al. | ..................... | 716/52 |
| 7,434,198 B2 * | 10/2008 | Strelkova et al. | ................ | 716/53 |
| 7,735,053 B2 * | 6/2010 | Harazaki | ......................... | 716/53 |
| 7,849,423 B1 * | 12/2010 | Yenikaya et al. | ............. | 716/132 |
| 8,321,818 B2 * | 11/2012 | Agarwal et al. | ................. | 716/53 |
| 8,331,646 B2 * | 12/2012 | Agarwal et al. | ............... | 382/144 |
| 8,429,571 B2 * | 4/2013 | Kim | ................................ | 716/53 |
| 8,464,185 B2 * | 6/2013 | Granik | ............................ | 716/51 |
| 2005/0055658 A1 * | 3/2005 | Mukherjee et al. | ............. | 716/19 |
| 2008/0127027 A1 * | 5/2008 | Gallatin et al. | .................. | 716/19 |
| 2008/0301611 A1 * | 12/2008 | Word et al. | ..................... | 716/9 |
| 2008/0301623 A1 * | 12/2008 | Tsai et al. | ....................... | 716/21 |
| 2009/0210838 A1 * | 8/2009 | Al-Imam | .......................... | 716/5 |
| 2010/0023916 A1 * | 1/2010 | Chew et al. | ..................... | 716/19 |
| 2010/0122231 A1 * | 5/2010 | Agarwal et al. | ................ | 716/19 |
| 2010/0262940 A1 * | 10/2010 | Dewey et al. | ..................... | 716/5 |
| 2010/0333049 A1 * | 12/2010 | Agarwal et al. | ................ | 716/55 |

(Continued)

OTHER PUBLICATIONS

"Study of Model based etch bias retarget for OPC", by Qingwei Liu, Renqiang Cheng, Liguo Zhang, @2010 SPIE.*

*Primary Examiner* — Nha Nguyen
(74) *Attorney, Agent, or Firm* — Ingrassia Fisher & Lorenz, P.C.

(57) ABSTRACT

Methods for modifying a layout design of an integrated circuit using model-based retargeting are provided. In one embodiment, a method for modifying an integrated circuit layout design includes providing an initial integrated circuit layout design, correcting the initial layout design for etch-induced lithography errors to generate an etch-corrected layout design, and fragmenting the etch-corrected layout design to generate a fragmented layout design comprising a plurality of fragments. The method further includes performing a bridging condition simulation and a pinching condition simulation on the fragmented layout design and calculating a required movement for at least one fragment of the fragmented layout design based on the bridging condition simulation and the pinching condition simulation. Still further, the method includes modifying the fragmented layout design by moving the at least one fragment in accordance with the required movement to generate a modified layout design and performing optical proximity correction on the modified layout design.

19 Claims, 11 Drawing Sheets

(56) References Cited

U.S. PATENT DOCUMENTS

2011/0119642 A1* 5/2011 Agarwal et al. ................. 716/50
2012/0054694 A1 3/2012 Hamouda
2013/0219348 A1* 8/2013 Ye et al. .......................... 716/52
2013/0268901 A1* 10/2013 Lu et al. .......................... 716/52

* cited by examiner

METHODS FOR MODIFYING AN INTEGRATED CIRCUIT LAYOUT DESIGN

TECHNICAL FIELD

Embodiments of the present disclosure are directed to integrated circuit manufacturing. More particularly, embodiments of the present disclosure are directed to methods for modifying an integrated circuit layout design using model-based retargeting.

BACKGROUND

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools) are commonly used for both of these tasks.

Circuit layout descriptions can be provided in several different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or polylines, circles and textboxes). Other formats include the more recent Open Artwork System Interchange Standard (OASIS) proposed by Semiconductor Equipment and Materials International (SEMI), for example. These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. One of these techniques, "optical proximity correction" or "optical process correction" (OPC), adjusts the amplitude of the light transmitted through a lithographic mask by modifying the design layout data employed to create the mask. For example, edges in the design layout may be adjusted to make certain portions of the geometric elements larger or smaller, in accordance with how much additional light exposure (or lack of exposure) is desired at certain points on the substrate. When these adjustments are appropriately calibrated, overall pattern fidelity is greatly improved.

Even with the application of RETs, some layout regions may still have printability issues. These regions are called lithography "hotspots" or "litho hotspots." Litho hotspots can only be corrected by modifying design layouts in such a manner as to cause a change in the final printed contours. For example, "pinching" hotspots require an increase of the width of a printed contour subject to pinching while "bridging" hotspots requires an increase of the spacing between two printed contours subject to bridging. The layout modification procedure may be performed by either manufacturers or designers. As for the former, the procedure is sometimes referred to as "retargeting" since it involves the adjustment of drawn shapes to serve as targets for eventual wafer contours. While OPC and process window (PW) simulation can be used to guide the retargeting, that approach is expensive and time consuming.

Accordingly, it is desirable to provide new techniques and methods that can locate lithography hotspots and modify design layouts more efficiently. It is further desirable to provide such methods that enable a layout designer to predict the effects of process variations on the printability of a specific design and then to adjust the design accordingly. Furthermore, other desirable features and characteristics of the present disclosure will become apparent from the subsequent detailed description and the appended claims, taken in conjunction with the accompanying drawings and this background.

BRIEF SUMMARY OF THE INVENTION

Methods for modifying a layout design of an integrated circuit using model-based retargeting are provided. In one embodiment, a method for modifying an integrated circuit layout design includes providing an initial integrated circuit layout design, correcting the initial layout design for etch-induced lithography errors to generate an etch-corrected layout design, and fragmenting the etch-corrected layout design to generate a fragmented layout design comprising a plurality of fragments. The method further includes performing a bridging condition simulation and a pinching condition simulation on the fragmented layout design and calculating a required movement for at least one fragment of the fragmented layout design based on the bridging condition simulation and the pinching condition simulation. Still further, the method includes modifying the fragmented layout design by moving the at least one fragment in accordance with the required movement to generate a modified layout design and performing optical proximity correction on the modified layout design.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the embodiments set forth herein or the application and uses of the embodiments. Furthermore, there is no intention to be bound by any theory presented in the preceding background or the following detailed description.

In the design of integrated circuits, some design layout features may encounter printability issues due to the size or spacing of the design layout features. These lithography hotspot regions can only be corrected by modifying design layouts in such a manner as to cause a change in the final printed contours. For example, "pinching" hotspots require an increase of the width of a printed contour subject to pinching while "bridging" hotspots requires an increase of the spacing between two printed contours subject to bridging. Embodiments of the present disclosure provide new techniques and methods that can locate lithography hotspots and modify design layouts more efficiently than traditional OPC tools known in the art. The disclosed embodiments further enable a layout designer to predict the effects of process variations on the printability of a specific design and then to adjust the design accordingly.

The execution of the various exemplary model-based design retargeting processes disclosed herein may be implemented using computer-executable software instructions executed by one or more programmable computing devices. Because these exemplary embodiments may be implemented using software instructions, the components and operation of a generic programmable computer system on which various embodiments may be employed will first be described. Further, because of the complexity of some electronic design retargeting processes and the large size of many circuit designs, various electronic design retargeting tools are configured to operate on a computing system capable of simultaneously running multiple processing threads. The components and operation of a computer network having a host or master computer and one or more remote or slave computers therefore will be described with reference to FIG. 1. This operating environment is only one example of a suitable operating environment, however, and is not intended to suggest any limitation as to the scope of use or functionality of the described embodiments.

Figure 1:
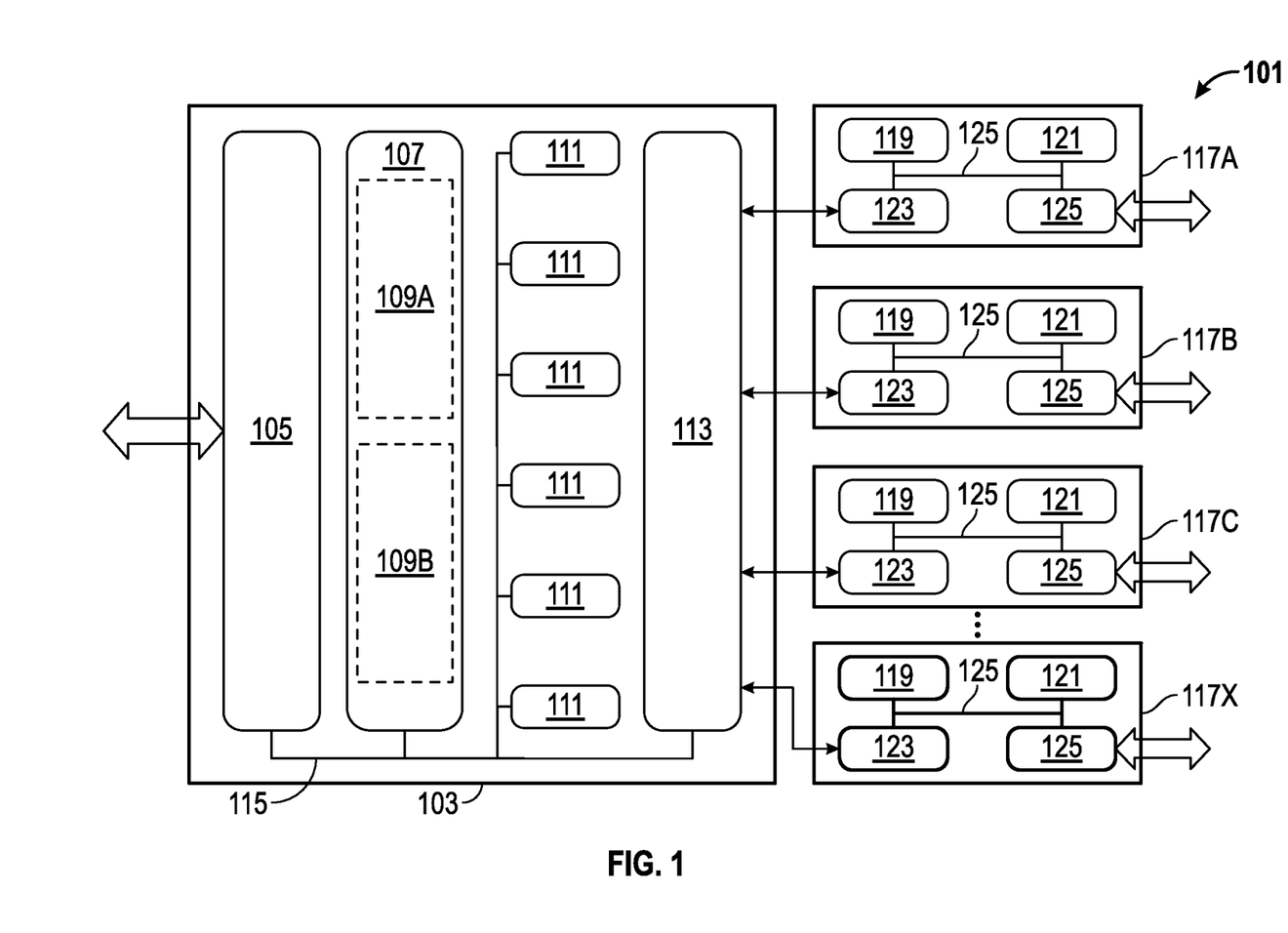
FIG. 1 illustrates an exemplary computing system that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, non-transitory media such as microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more model-based retargeting operations according to various exemplary embodiments. Accordingly, the memory 107 stores software instructions 109A that, when executed, will implement a software application for performing one or more such operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
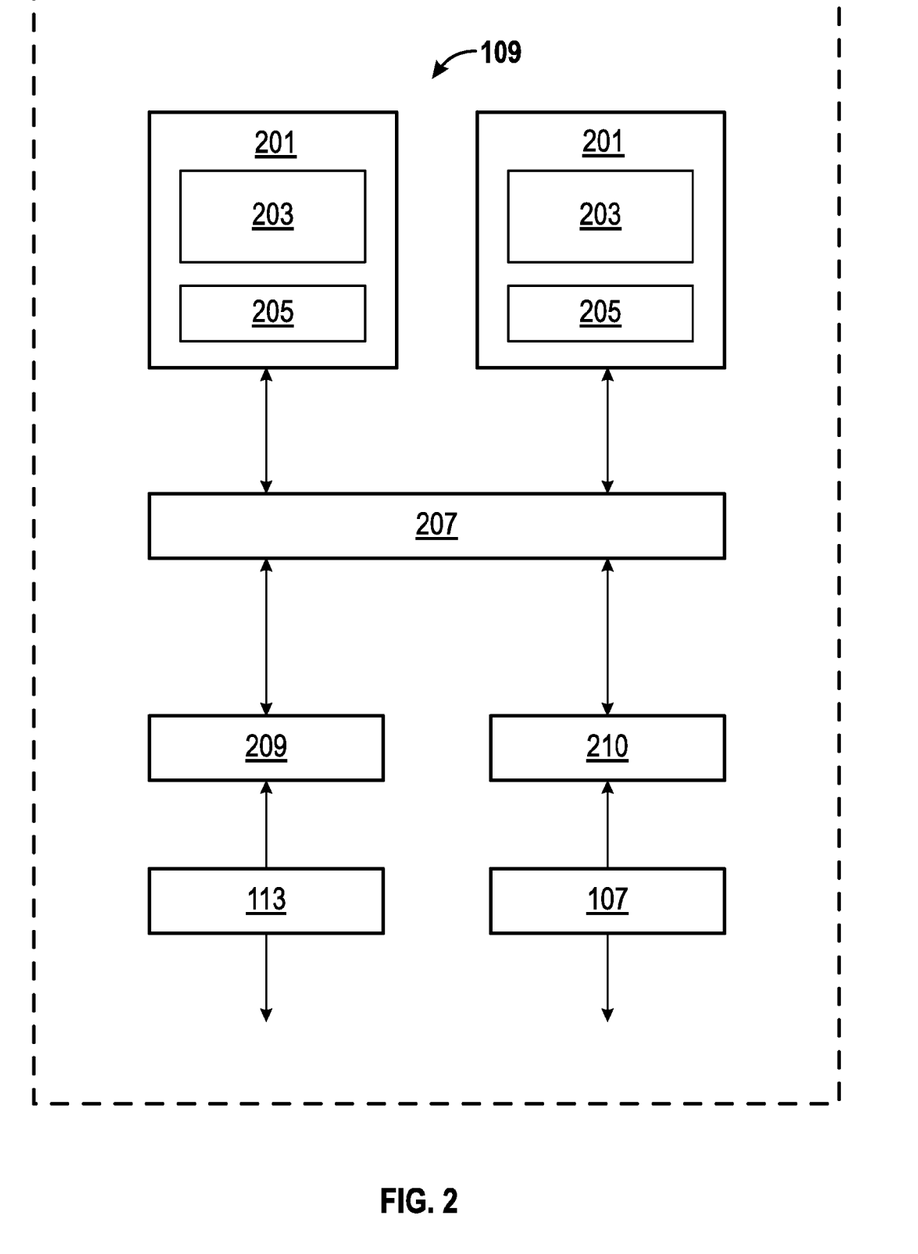
FIG. 2 illustrates an exemplary multi-core processor unit associated with the computing system shown in FIG. 1 that may be used to implement various embodiments of the invention.

In some embodiments, the master computing device 103 may employ one or more processing units 111 having more than one processor core. Accordingly, FIG. 2 illustrates an example of a multi-core processor unit 111 that may be employed with various embodiments. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR, and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. The processor cores 201 communicate through the interconnect 207 with an input/output interfaces 209 and a memory controller 211. The input/output interface 209 provides a communication interface between the processor unit 201 and the bus 115. Similarly, the memory controller 211 controls the exchange of information between the processor unit 201 and the system memory 107. In some embodiments, the processor units 201 may include additional components, such as a high-level cache memory accessible shared by the processor cores 201.

While FIG. 2 shows one illustration of a processor unit 201 that may be employed by some embodiments, it should be appreciated that this illustration is representative only, and is not intended to be limiting. For example, some embodiments may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 128×128 bit registers, four single-precision floating point computational units, four integer computational units, and a 256 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the slave computers 117A, 117B, 117C . . . 117X through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 122, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate embodiments may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers, it should be noted that, with alternate embodiments, either the computer 103, one or more of the slave computers 117, or some combination of both may use two or more different interface devices 113 or 123 for communicating over multiple communication interfaces.

In some embodiments, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations, one or more of the slave computers 117 may alternately or additionally be connected to one or more external data storage devices. Typically, these external data storage devices will include data storage devices that also are connected to the master computer 103, but they also may be different from any data storage devices accessible by the master computer 103.

Figure 3:
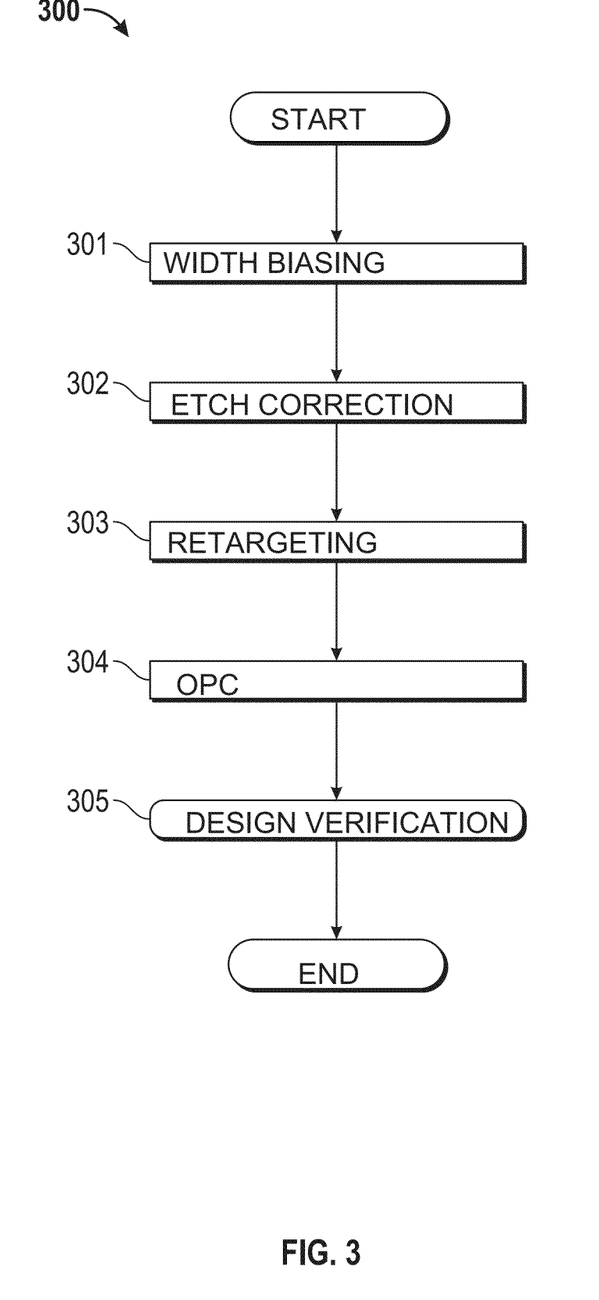
FIG. 3 is a flowchart illustrating a method for generating a layout design in accordance with various embodiments of the present disclosure.

Computer network 101 may be employed to generate a retargeted layout design for process yield improvement using a method 300 as set forth in FIG. 3. The method 300 includes an initial step 301 of contextually-sensitive width biasing of the features in the layout design. One example width biasing suitable for use in method 300 is CATastrophic Optical Proximity Correction (CATOPC), which widens isolated layout features to make them easier to print. Therefore, isolated features have more width variability than wires that are not isolated. CATOPC is a standard process in many existing layout design generation methods, and as such the details thereof are expected to be well-known to those having ordinary skill in the art. The result of performing step 301 on the layout design is a CATOPC-corrected design that includes contextually-sensitive width biasing. In alternative embodiments, width biasing such as CATOPC is omitted from the method 300. In still further alternative embodiments, width biasing is performed subsequent to an etch proximity effect correction process, as is described in greater detail below regarding step 302 for method 300.

As alluded to above, etch proximity effects are created in lithographic processes by the complex physical, transport, and chemical interactions in an etch chamber. Moreover, etch proximity-effects are heavily influenced by the actual layout of the integrated circuit. One of the important sources for etch proximity-effects is the deposition of passivant molecules from the gas phase during etch processing. Passivant molecules may be produced due to the breakdown of the photoresist material employed in the etching process. Since the pressure in the etch chamber is very low, these molecules usually move in straight lines, i.e. collisionlessly, through the gas phase. Furthermore, passivant molecules typically have a high sticking coefficient. As a result, they deposit preferentially on sidewalls adjacent to wide trench areas. In contrast, the transport of passivant molecules into dense features is limited. Thus, it is typically desirable to employ an etch proximity effect correction process 302 during the method for generating a layout design 300. As is known in the art, this correction process factors into account the various physical, transport, and chemical interactions that occur during the etching process, employing a model that is typically in the form of a statistical function. The result of performing step 302 on the layout design is an etch-corrected layout design that accounts for the proximity effects created during the etching process.

Figure 4:
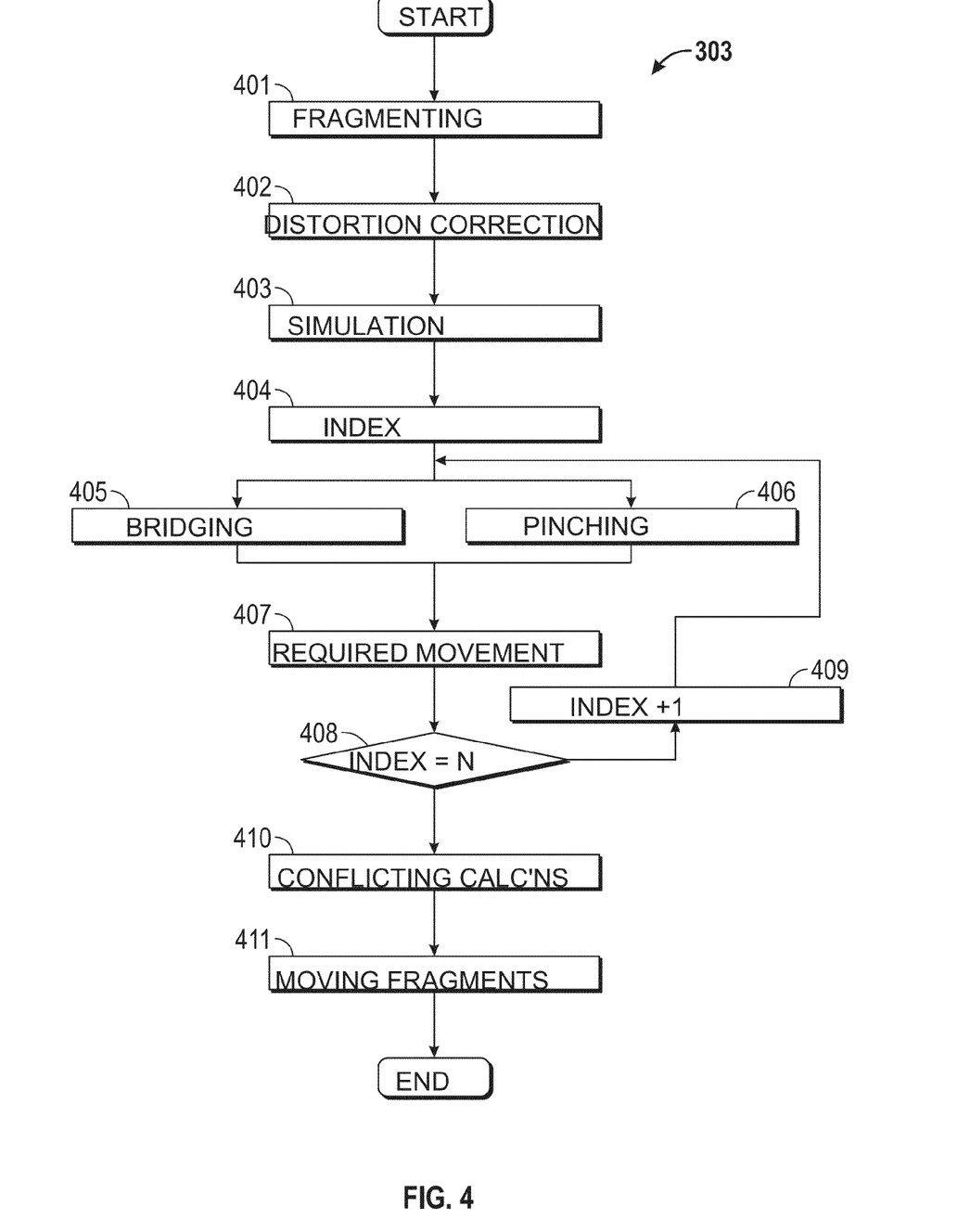
FIG. 4 is a flowchart illustrating a method for model-based retargeting of a layout design, suitable for use in connection with the method shown in FIG. 3.
Figure 5:
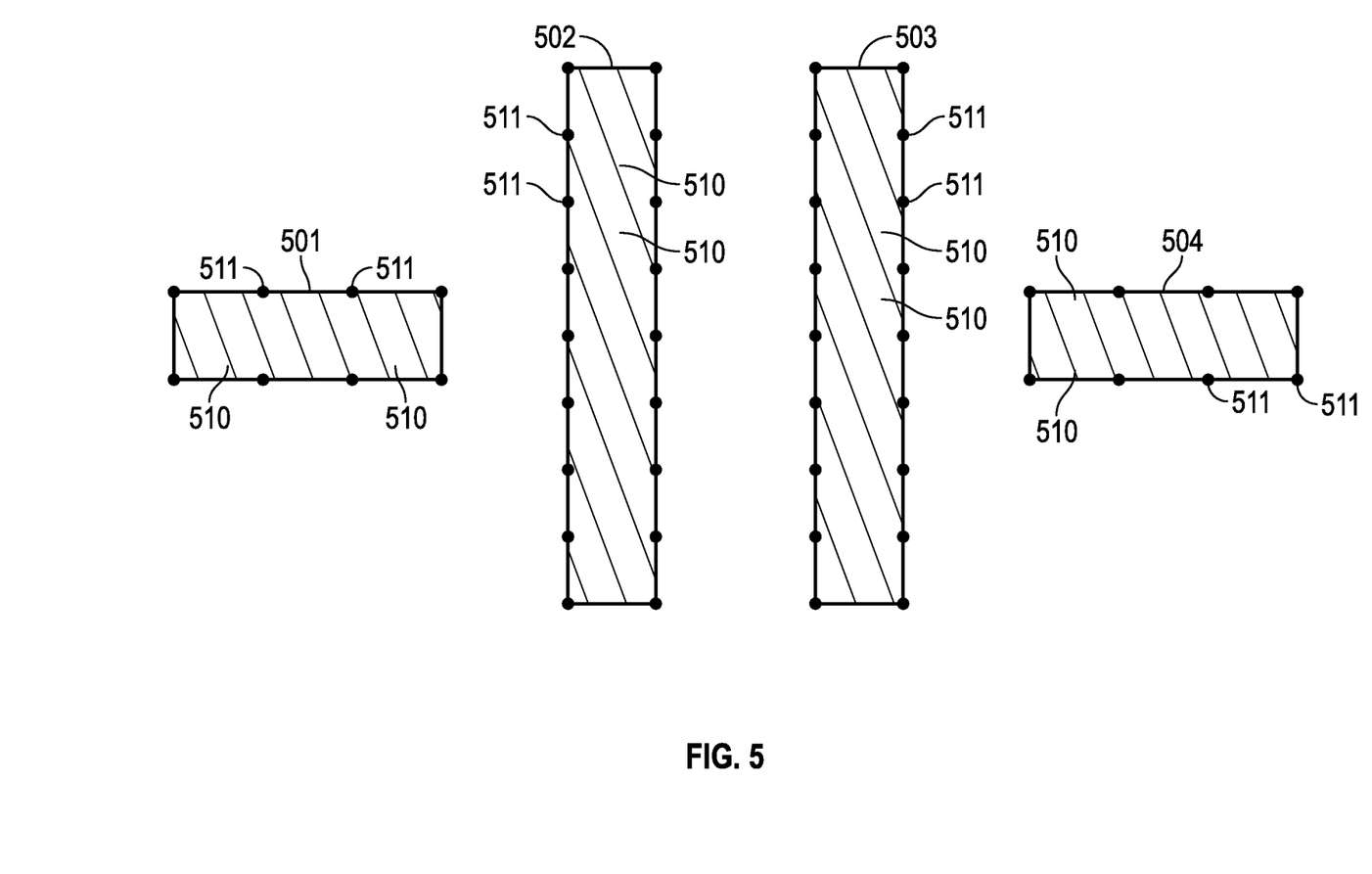
FIG. 5 illustrates a plurality of fragmented polygons as may be created during the model-based retargeting method of FIG. 4.

Subsequent to etch correction and optional width biasing, the method 300 continues with a step 303 of model-based retargeting. Model-based retargeting is employed to identify and correct various lithography hotspots that could result in process failures during the semiconductor manufacturing process. The step 303 of model-based retargeting is expanded in greater detail in the flowchart shown in FIG. 4. As shown therein, the model-based retargeting process includes an initial step 401 of fragmenting the layout design. As will be appreciated by those skilled in the art, each feature of the layout design to be created on a wafer is defined as a series of vertices that make up a polygon having a shape of the desired feature. Thus, the polygons can be fragmented by dividing the perimeter of the polygon into a plurality of edge fragments. For example, as shown in FIG. 5, exemplary polygons 501, 502, 503, and 504 are fragmented into a plurality of edge fragments 510. The edge fragments are defined by a plurality of fragmentation points 511. It is desirable to fragment the polygons 501-504 with a sufficient number of fragmentation points 511 so that image fidelity is acceptable and so processing time is not prohibitive.

Thereafter, at process step 402, the edge fragments in the layout design may optionally be moved in order to pre-compensate for the expected optical distortions that will occur during processing so that the position of the edges created on a wafer will more closely match the desired positions. In order to correct for optical distortions, at least some of the edge fragments 510 positioned between the fragmentation points 511 are moved inwardly or outwardly to compensate for expected optical distortions, in accordance with established models. The result of performing step 402 on the layout design (if desired) is an optical distortion-corrected design.

Figure 6:
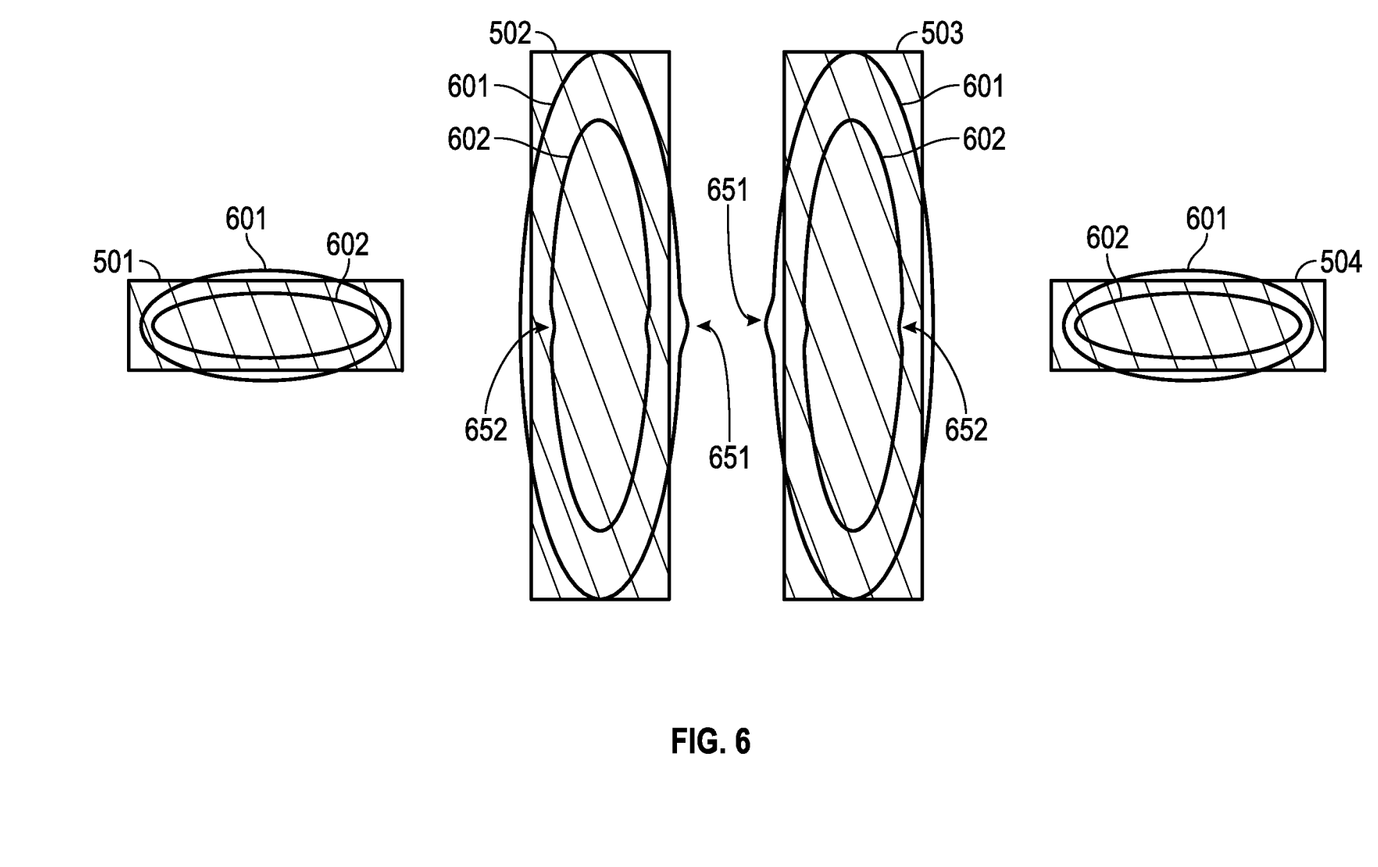
FIG. 6 illustrates simulated lithography patterns in accordance with the polygons shown in FIG. 5.

Thereafter, regardless of whether step 402 has been performed, the model-based retargeting process continues with step 403 of generating a computer simulation that takes the layout design and manipulates the data set constituting the layout design to simulate potential edge placement errors under various process conditionals. In one exemplary simulation, the data is manipulated to change the outer contours of the features to simulate potential contour bridging errors. In another exemplary simulation, the data is manipulated to change the outer contour of the features to simulate potential contour pinching errors. Referring now to FIG. 6, associated with each fragment 510 is a simulation site that defines a number of sample points at which the image intensity during photolithographic processing is estimated to produce the simulation. From the estimated image intensity points, a determination is made of the expected edge placement error of the edge fragment under the given conditions (either bridging or pinching). FIG. 6 illustrates the results of performing the simulations on polygons 501-504. Lines 601 show the simulated patterns under bridging conditions, whereas lines 602 show the simulated patterns under pinching conditions. Comparing the location of the simulation lines 601, 602 with the polygons 501-504 of the layout design, it can be seen that many simulation sites deviate significantly from the desired outline of the polygon. For example, at point 651, the lines 601 deviate in a manner that the minimum separation between features is violated, resulting in a bridging error. In another example, at points 652, the lines 602 deviate in a manner that the minimum feature width is violated, resulting in a pinching error.

As noted above, the simulation is performed on a segment-by-segment basis. As such, returning to FIG. 4, the model based retargeting process begins with the fragment index (i.e., an ordered list of the fragments generated in the fragmenting step) equal to 1, at step 404. Thereafter, the simulations for bridging and pinching are performed at steps 405 and 406, respectively. Once the simulation is performed for a given fragment, the model-based retargeting process calculates a required movement of the fragment at step 407 to correct for any bridging or pinching under the simulated conditions. In this manner, it is possible to arrive at a corrected data set in an attempt to compensate for the above-mentioned concerns. Once the required movement, if any, is calculated, it is determined at step 408 whether the fragment index is less than the total number of fragments (N), and if so, the fragment index is increased by 1 at step 409, and the bridging/pinching process begins anew at steps 405 and 406. If, however, the current fragment index is determined to be equal to N at step 408, the model-based retargeting process continues to step 410.

At step 410, the model-based retargeting process resolves any conflicting calculated segment movements. For example, it may be determined that a particular segment would potentially be subjected to both pinching and bridging under various conditions, and conflicting movements may be prescribed. In this case, it is necessary to resolve any conflict by selecting the higher priority movement. In one example, conflict resolution 410 can be accomplished by moving one or more adjacent segments. For example, moving a segment that is adjacent to the conflicted segment may result in a corresponding movement of the conflicted segment to maintain the fidelity of the layout, which may resolve the conflict. In another example, a determination may be made as to the criticality of the potential edge placement error. For example, if it is determined that bridging would potentially occur with a layout design feature that is more critical than the fragment itself, the conflict would be resolved so as to select a movement that eliminates any potential bridging, as compared to pinching at the fragment.

Figure 7:
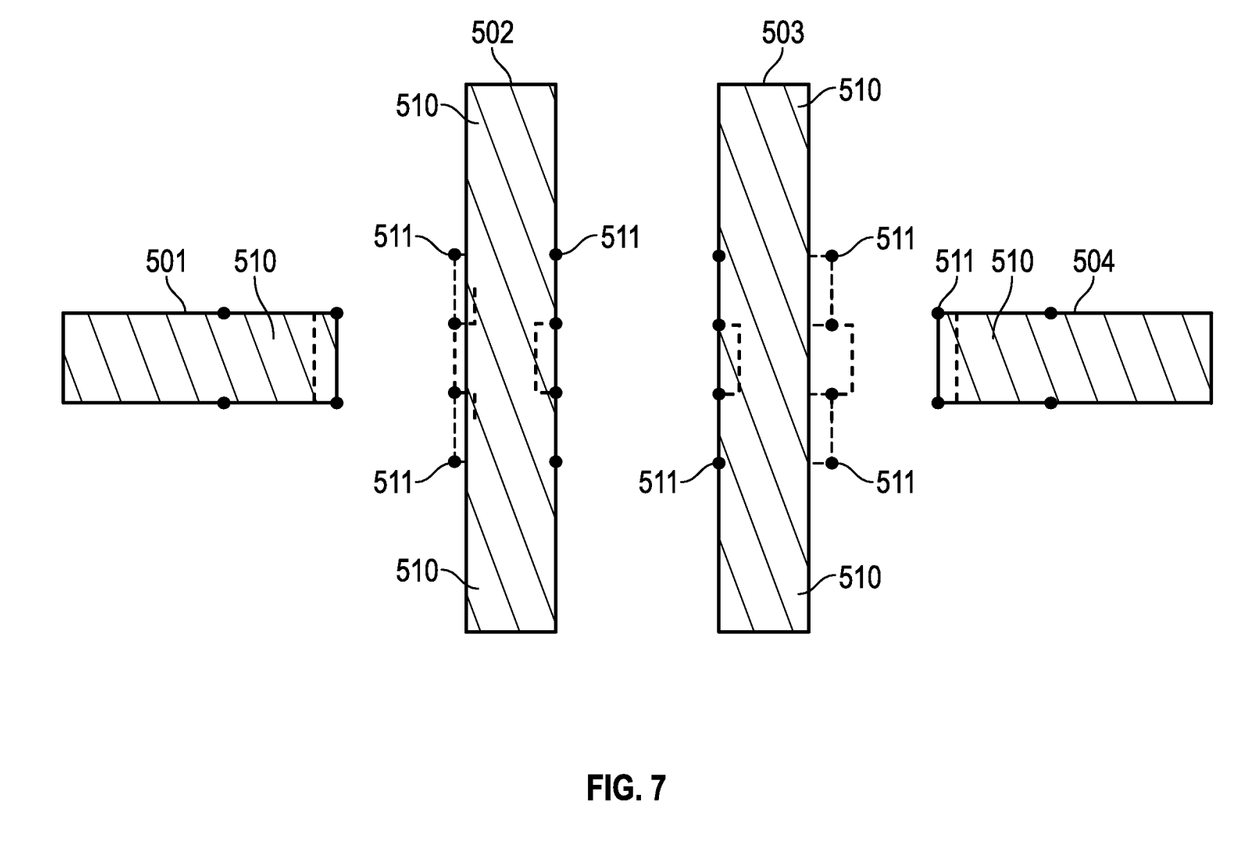
FIG. 7 illustrates fragment movements in the polygons shown in FIG. 5 to reduce the potential for manufacturing errors.

Once the move for each fragment have been determined, if any, the model-based retargeting process concludes with a step 411 of moving the fragments in accordance with the calculated movements. FIG. 7 illustrates such a movement of the fragments on the exemplary polygons 501-504. For example, the segment 510 of polygon 502 that is closest to polygon 501 is moved closer to polygon 501 to eliminate the potential for pinching. Likewise, the segment 510 of polygon 501 that is closest to polygon 502 is moved away from polygon 502 to eliminate the potential for bridging. Like moves are made in connection with polygons 503 and 504. The result of performing step 412 on the layout design is a retargeted design that has a reduced number of potential lithography hotspots.

It will be appreciated that the retargeting process 303 may be completed in one or more iterations. In embodiments where multiple iterations are performed, the process begins with fragmenting (401), and then continues with multiple iterations of simulation/movement to generate a more refined, retargeted layout design.

Returning now to method 300 illustrated in FIG. 3, with the model-based retargeting step 303 completed, the method 300 continues with a step 304 of performing optical proximity correction on the retargeted design layout. As noted above, optical proximity correction adjusts the amplitude of the light transmitted through a lithographic mask by modifying the design layout data employed to create the mask. For example, edges in the design layout may be adjusted to make certain portions of the geometric elements larger or smaller, in accordance with how much additional light exposure (or lack of exposure) is desired at certain points on the substrate. When these adjustments are appropriately calibrated, overall pattern fidelity is greatly improved. Optical proximity correction may be performed using any of the various software programs currently employed in the art.

Method 300 concludes at step 305 with a step of design verification and implementation. This verification is referred by different names in the art such as optical rule checking (ORC), lithography rule checking (LRC), and silicon vs. layout checking. In this step, the layout design data from the OPC step 304 is further analyzed to verify mapping between logical design and physical design. In this regard, the layout data is verified to ensure performance specifications, especially in terms of timing, power, and signal integrity. If the layout design is verified satisfactorily during the verification process, the design is handed over for manufacturing. This milestone is referred as "design tape-out." Once the design is finalized in software, it is taped-out. After tape-out, the process goes through fabrication, packaging, and assembly. The process eventually culminates with the production of completed integrated circuits.

Figure 8:
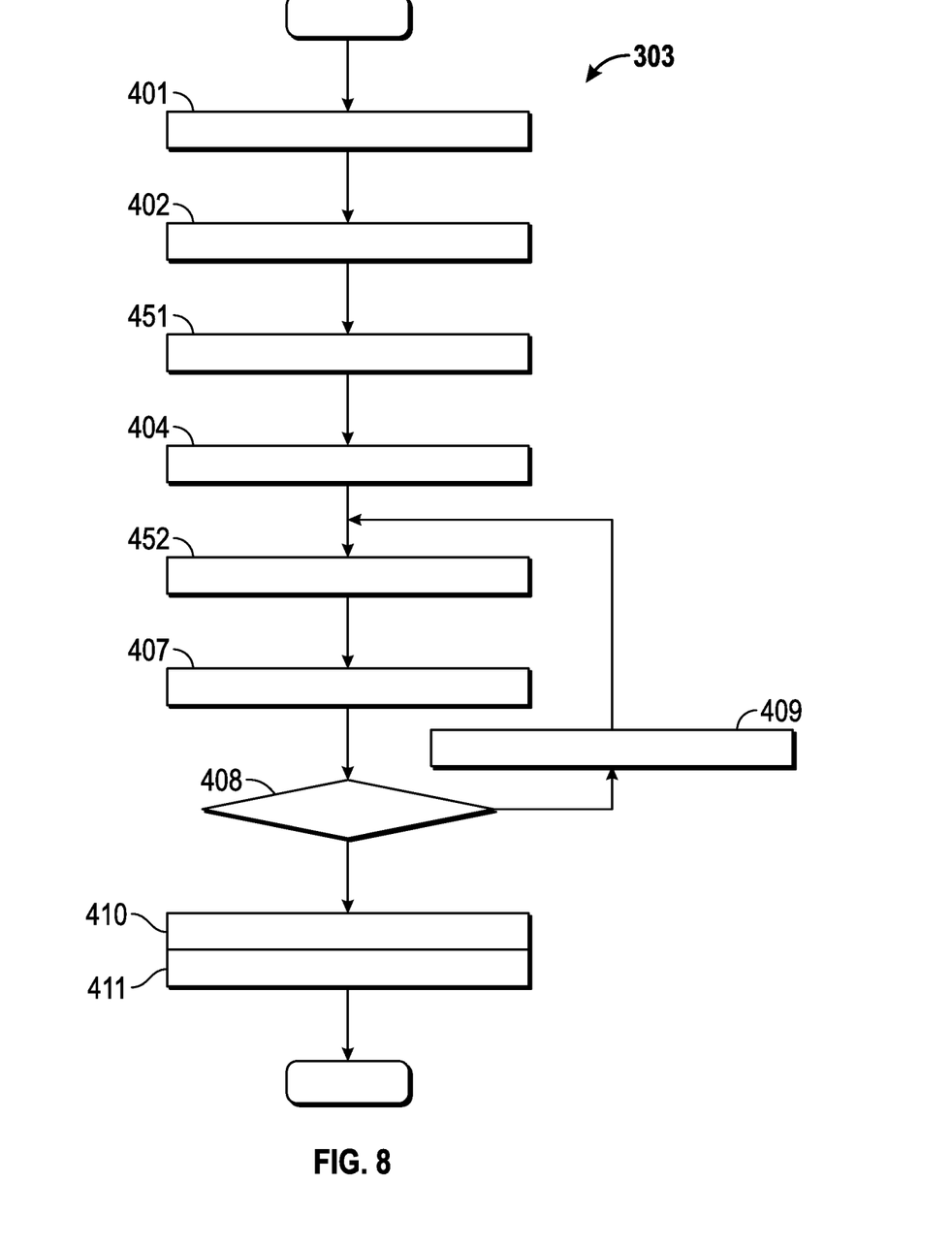
FIG. 8 is a flowchart illustrating an alternative method for model-based retargeting of a layout design.

An alternative process 800 for model-based retargeting is illustrated in FIG. 8. As shown therein, the process begins as in FIG. 4 with steps 401 and 402, performed as described above. After the initial fragment movement at step 402, however, the process 800 continues with a step of calculating "aerial image" parameters of the layout design. As is well-known in the art, projection imaging tools, such as scanners, steppers, or step-and-scan tools, project an image of a mask pattern into air, and then ultimately into the photoresist. The aerial image is the mask image projected onto the plane of the photoresist-coated wafer but assuming that only air occupies this space rather than the photoresist-coated wafer. The aerial image shows a distribution of light intensity as a function of spatial position within (or near) the image plane. The quality of the aerial image dictates the quality and controllability of the final resist profile, i.e., the printed image. Accordingly, aerial image parameters may be used to predict printability. The classic metric of the aerial image quality is image contrast. However, this aerial image parameter alone may not be sufficient for identifying non-litho-friendly areas. Aerial image parameters can include, for example, maximum and minimum intensities ($I_{max}$, $I_{min}$, respectively) and corresponding image contrast values. Various combinations of aerial image parameters, such as the $I_{max}$ and $I_{min}$ pair, may serve as printability indicators and be used to locate non-litho-friendly areas.

For each fragment, the process 800 computes the required width and space of each layout feature (step 452) based on the aerial image parameters. For example, for pinching hotspots, the data computation may include the worst width, i.e., the narrowest width that can be reached under various process window conditions, while for bridging hotspots, the data computation may include the worst spacing, i.e., the narrowest spacing that can be reached under various process window conditions. Steps 407-411 then continue as described above with regard to FIG. 4, with the movements being calculated based on the aerial image parameters instead of the data derived from the two simulation conditions (i.e., bridging/pinching).

Figure 9:
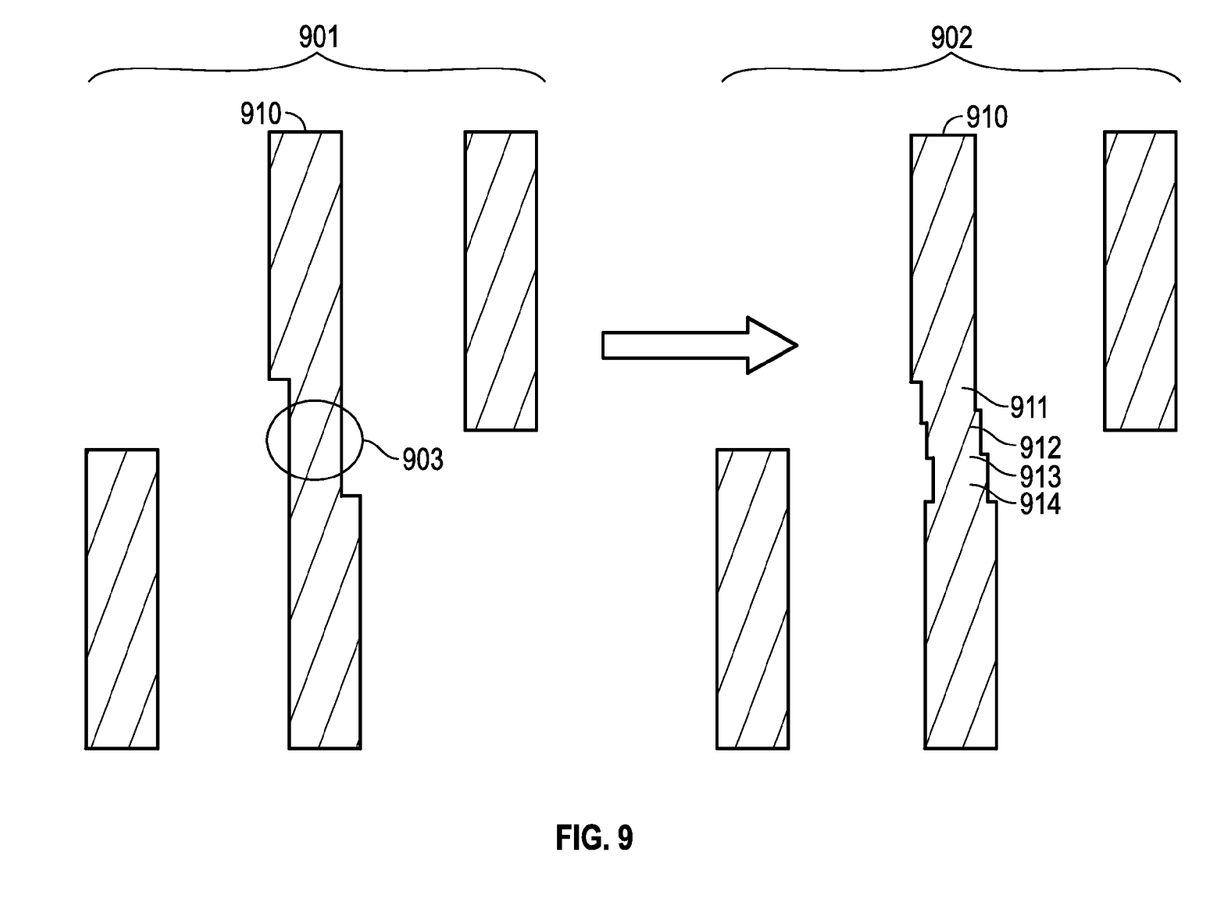
FIGS. 9-11 illustrate additional examples of segment movements to eliminate hotspots in accordance with the model-based retargeting methods described herein.
Figure 10:
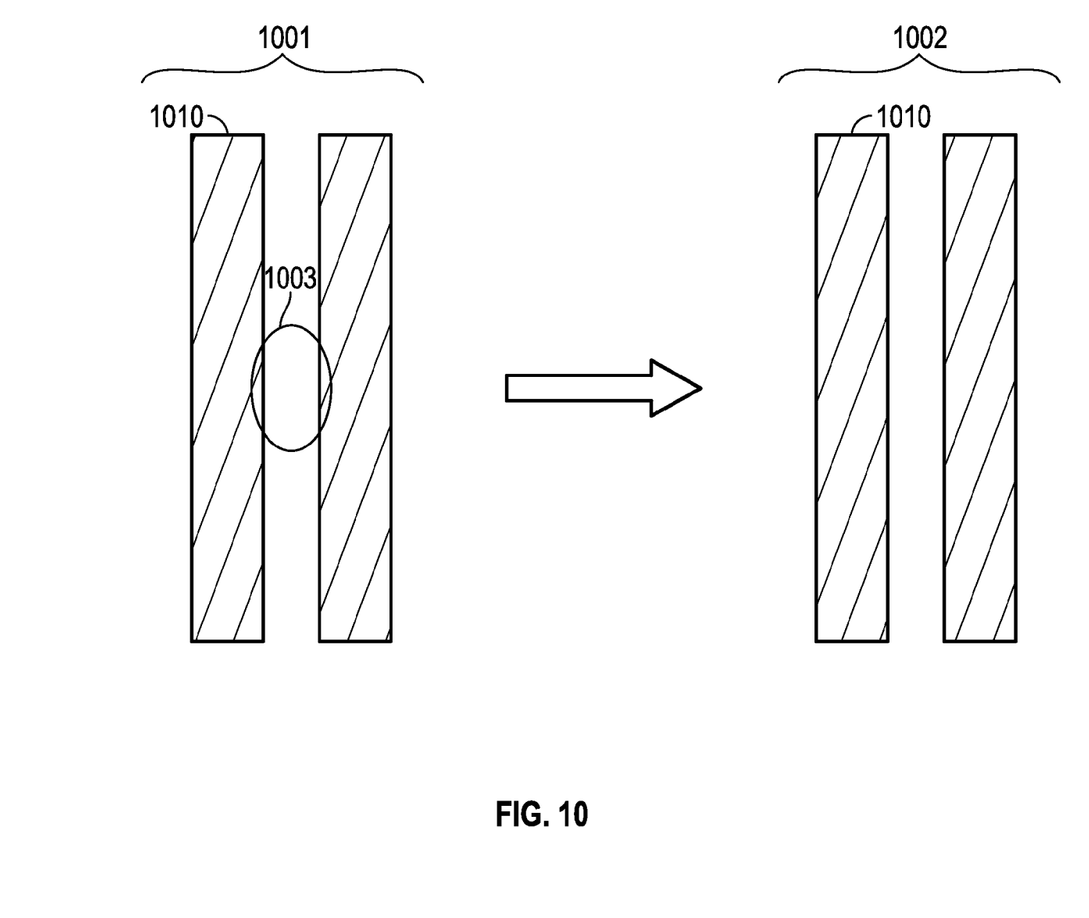
Figure 11:
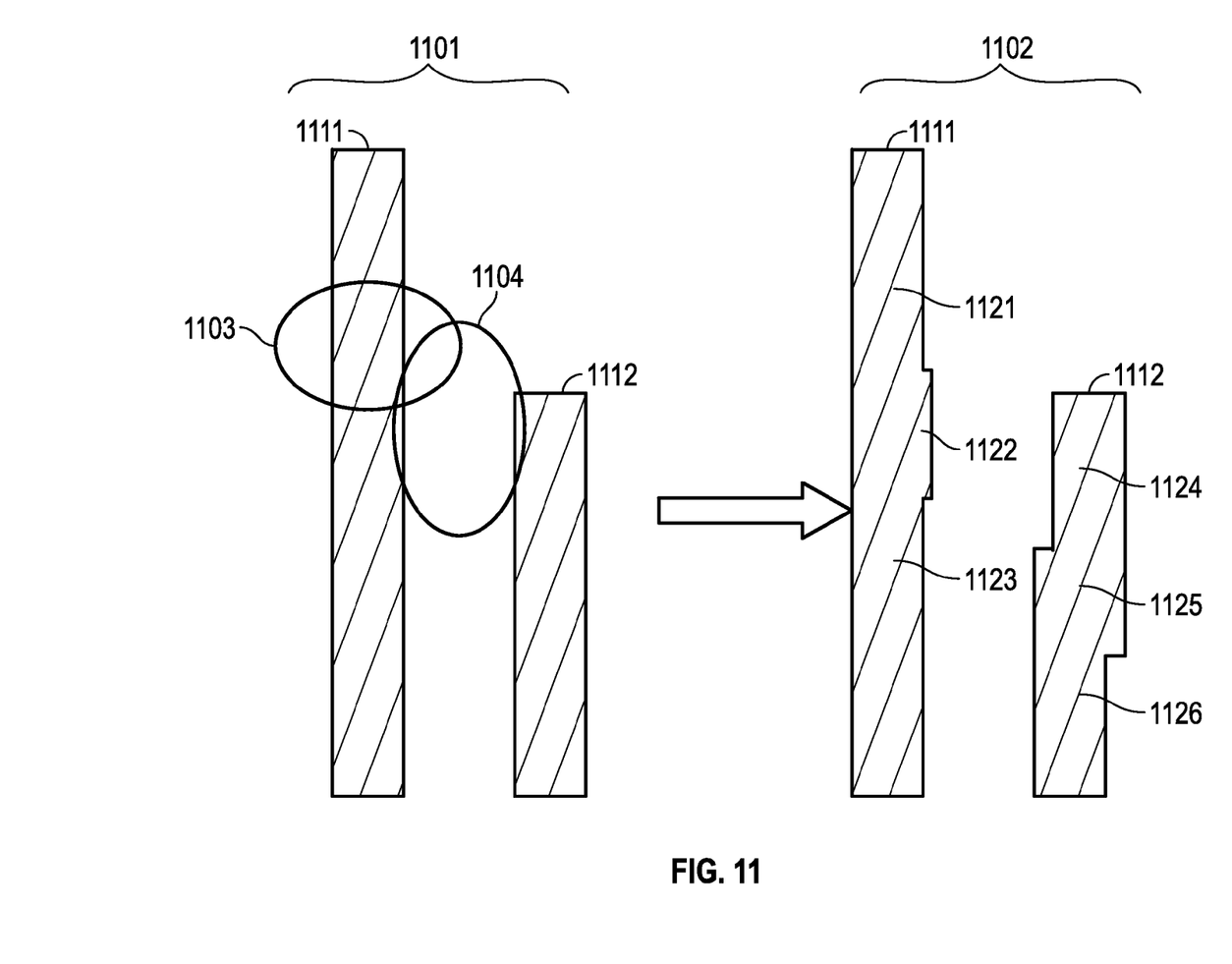

FIGS. 9-11 illustrate additional, non-limiting examples of segment movements to eliminate hotspots in accordance with the model-based retargeting methods described herein. As shown in FIG. 9, the initial layout design 901 includes a minimum width violation problem which, under a pinching condition simulation would show a potential pinching error occurring in the circled region 903. Using the retargeting methods described herein, the feature 910 of modified retargeted layout design 902 is segmented into a plurality of segments (for example, segments 911-914) and moved to eliminate the pinching issue, while continuing to avoid potential bridging issues with neighboring design features.

As shown in FIG. 10, the initial layout design 1001 includes a minimum spacing violation problem which, under a bridging condition simulation would show a potential bridging error occurring in the circled region 1003. Using the retargeting methods described herein, the feature 1010 of modified retargeted layout design 1002 is segmented into a plurality of segments (not shown) and moved away from the adjacent feature (each segment by a similar amount) to eliminate the bridging issue.

As further shown in FIG. 11, the initial layout design 1101 includes both a minimum width violation problem and a minimum spacing violation problem which, under various simulated conditions could result in either pinching or bridging (circled areas 1103 and 1104, respectively). In this case, both features 1111 and 1112 of retargeted layout design 1102 are segmented (into segments 1121-1126) and moved to eliminate the potential bridging/pinching issue and to avoid other potential bridging/pinching issues that may be caused by their movement.

As such, disclosed herein are improved layout design retargeting methods that can locate lithography hotspots and modify design layouts more efficiently than traditional OPC tools known in the art. The embodiments exhibit numerous advantages over the prior art, including the early identification of lithography hotspots, increased speed over traditional process window OPC, and the ability to generate design solutions during the design phase.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the disclosure as set forth in the appended claims and their legal equivalents.

What is claimed is:

1. A method for modifying an integrated circuit layout design, the method comprising:
   providing an initial integrated circuit layout design;
   correcting the initial layout design for etch-induced lithography errors to generate an etch-corrected layout design;
   fragmenting the etch-corrected layout design to generate a fragmented layout design comprising a plurality of fragments;
   performing both a bridging condition simulation and a pinching condition simulation on the fragmented layout design, wherein each of the bridging and pinching condition simulations comprises manipulating the fragmented layout design according to various process conditionals that have the potential to result in bridging errors and pinching errors, respectively;
   calculating, by using a computer, a required movement for at least one fragment of the fragmented layout design based on the bridging condition simulation and the pinching condition simulation;
   modifying the fragmented layout design by moving the at least one fragment in accordance with the required movement to generate a modified design; and
   performing optical proximity correction (OPC) on the modified layout design; and
   determining that there is a conflict between a required movement to correct a bridging condition and a required movement to correct a pinching condition, and resolving the conflict by determining a priority of movement between the required movement to correct the bridging condition and the requirement movement to correct the pinching condition, and performing the movement according to the priority.

2. The method of claim 1, further comprising performing a catastrophic optical proximity correction (CATOPC) procedure on the initial integrated circuit layout design.

3. The method of claim 1, further comprising performing a catastrophic optical proximity correction (CATOPC) procedure on the etch-corrected layout design.

4. The method of claim 1, wherein providing an initial integrated circuit layout design comprises providing a layout design comprising at least one lithography hotspot.

5. The method of claim 1, wherein fragmenting the etch-corrected layout design comprises identifying a plurality of fragmentation points.

6. The method of claim 1, wherein fragmenting the etch-corrected layout design comprises generating a plurality of polygon-shaped fragments from the etch-corrected layout design.

7. The method of claim 1, wherein providing an initial integrated circuit layout design comprises providing a layout design comprising a plurality of polygon-shaped design features.

8. The method of claim 1, further comprising performing an optical rule checking (ORC) procedure on the OPC-corrected design.

9. The method of claim 1, further comprising sending the modified layout design to a manufacturing facility during a tape-out process.

10. The method of claim 9, further comprising manufacturing an integrated circuit using the modified layout design.

11. A system for modifying an integrated circuit layout design, the system comprising:
- a display device;
- a user input device;
- a storage device; and
- a processor electronically and communicatively coupled to the display device, the user input device, and the storage device and configured to perform the following procedures:
  - provide an initial integrated circuit layout design;
  - correct the initial layout design for etch-induced lithography errors to generate an etch-corrected layout design;
  - fragment the etch-corrected layout design to generate a fragmented layout design comprising a plurality of fragments;
  - perform both a bridging condition simulation and a pinching condition simulation on the fragmented layout design, wherein each of the bridging and pinching condition simulations comprises manipulating the fragmented layout design according to various process conditionals that have the potential to result in bridging errors and pinching errors, respectively;
  - calculate a required movement for at least one fragment of the fragmented layout design based on the bridging condition simulation and the pinching condition simulation;
  - modify the fragmented layout design by moving the at least one fragment in accordance with the required movement to generate a modified layout design;
  - perform optical proximity correction (OPC) on the modified layout design; and
  - determine that there is a conflict between a required movement to correct a bridging condition and a required movement to correct a pinching condition, and resolve the conflict by determining a priority of movement between the required movement to correct the bridging condition and the requirement movement to correct the pinching condition, and perform the movement according to the priority.

12. The system of claim 11, wherein the processor is further configured to perform the following procedure: perform a catastrophic optical proximity correction (CATOPC) procedure on the initial integrated circuit layout design.

13. The system of claim 11, wherein the processor is further configured to perform the following procedure: perform a catastrophic optical proximity correction (CATOPC) procedure on the etch-corrected layout design.

14. The system of claim 11, wherein providing an initial integrated circuit layout design comprises providing a layout design comprising at least one lithography hotspot.

15. The system of claim 11, wherein fragmenting the etch-corrected layout design comprises identifying a plurality of fragmentation points.

16. The system of claim 11, wherein fragmenting the etch-corrected layout design comprises generating a plurality of polygon-shaped fragments from the etch-corrected layout design.

17. The system of claim 11, wherein providing an initial integrated circuit layout design comprises providing a layout design comprising a plurality of polygon-shaped design features.

18. The system of claim 11, wherein the processor is further configured to perform the following procedure: performing an optical rule checking (ORC) procedure on the OPC-corrected design.

19. A non-transitory computer-readable medium comprising computer-readable instructions stored thereon, which, when executed by a computing system comprising a processor, cause the computing system to:
- provide an initial integrated circuit layout design;
- correct the initial layout design for etch-induced lithography errors to generate an etch-corrected layout design;
- fragment the etch-corrected layout design to generate a fragmented layout design comprising a plurality of fragments;
- perform both a bridging condition simulation and a pinching condition simulation on the fragmented layout design, wherein each of the bridging and pinching condition simulations comprises manipulating the fragmented layout design according to various process conditionals that have the potential to result in bridging errors and pinching errors, respectively;
- calculate a required movement for at least one fragment of the fragmented layout design based on the bridging condition simulation and the pinching condition simulation;
- modify the fragmented layout design by moving the at least one fragment in accordance with the required movement to generate a modified layout design; and
- perform optical proximity correction (OPC) on the modified layout design; and
- determine that there is a conflict between a required movement to correct a bridging condition and a required movement to correct a pinching condition, and resolve the conflict by determining a priority of movement between the required movement to correct the bridging condition and the requirement movement to correct the pinching condition, and perform the movement according to the priority.

* * * * *